United States Patent
Kreft et al.

[11] Patent Number: 5,949,399
[45] Date of Patent: Sep. 7, 1999

[54] ELECTRONIC SIGNAL MEASUREMENT APPARATUS FOR THE ACQUISITION AND DISPLAY OF SHORT-DURATION ANALOG SIGNAL EVENTS

[75] Inventors: Keith A. Kreft, Cupertino; Claes Georg Andersson, Fremont; Kenneth A. McQueeney, Los Gatos; Charles N. Villa, San Jose, all of Calif.

[73] Assignee: Snap-On Technologies, Inc., Lincolnshire, Ill.

[21] Appl. No.: 08/599,835

[22] Filed: Feb. 12, 1996

[51] Int. Cl.$^6$ .......................................................... G09G 5/00
[52] U.S. Cl. .............................................................. 345/134
[58] Field of Search ................................... 345/134, 135, 345/440

[56] References Cited

U.S. PATENT DOCUMENTS

| | | | |
|---|---|---|---|
| 3,765,009 | 10/1973 | Graves et al. | 345/134 |
| 4,143,365 | 3/1979 | Cayzac et al. | 345/134 |
| 4,145,754 | 3/1979 | Utzerath | 345/134 |
| 4,251,815 | 2/1981 | Dagostono | 345/134 |
| 4,370,646 | 1/1983 | Mahony | 345/134 |
| 4,477,803 | 10/1984 | Conrad | 345/134 |
| 4,536,760 | 8/1985 | Navarro et al. | 345/134 |
| 4,634,895 | 1/1987 | Luong . | |
| 4,809,189 | 2/1989 | Batson | 345/134 |
| 4,816,813 | 3/1989 | Furno et al. | 345/134 |
| 5,028,914 | 7/1991 | Povenmire | 345/134 |
| 5,129,722 | 7/1992 | Mader et al. | 345/134 |
| 5,247,287 | 9/1993 | Jonker et al. | 345/134 |
| 5,444,459 | 8/1995 | Moriyasu | 345/134 |
| 5,517,105 | 5/1996 | Holzwarth | 345/134 |
| 5,684,508 | 11/1997 | Brilman | 345/134 |
| 5,757,357 | 5/1998 | Grande et al. | 345/134 |

FOREIGN PATENT DOCUMENTS

| | | |
|---|---|---|
| 0 579 959 A2 | 1/1994 | European Pat. Off. . |
| 35 00 086 A1 | 7/1986 | Germany . |

OTHER PUBLICATIONS

J. Driscoll "Peak Monitoring—improving digital scope performance" Electronic Engineering No. 686, pp. 41–43, Feb. 1984, London.

*Primary Examiner*—Jeffery Brier
*Attorney, Agent, or Firm*—Claude A. S. Hamrick

[57] ABSTRACT

Electronic signal measurement apparatus for the acquisition and display of short-duration analog signal events, in the form of a hand-held instrument which includes maximum and minimum signal value detection circuits for capturing the extremes of a rapidly changing analog signal. The captured values are then digitized by an analog-to-digital converter to generate data which can be stored and subsequently displayed in the form of a histogram evidencing the occurrence or lack of occurrence of a particular type of signal event.

8 Claims, 4 Drawing Sheets

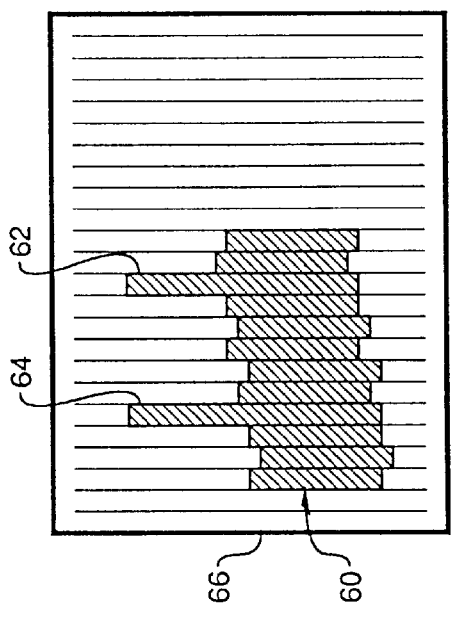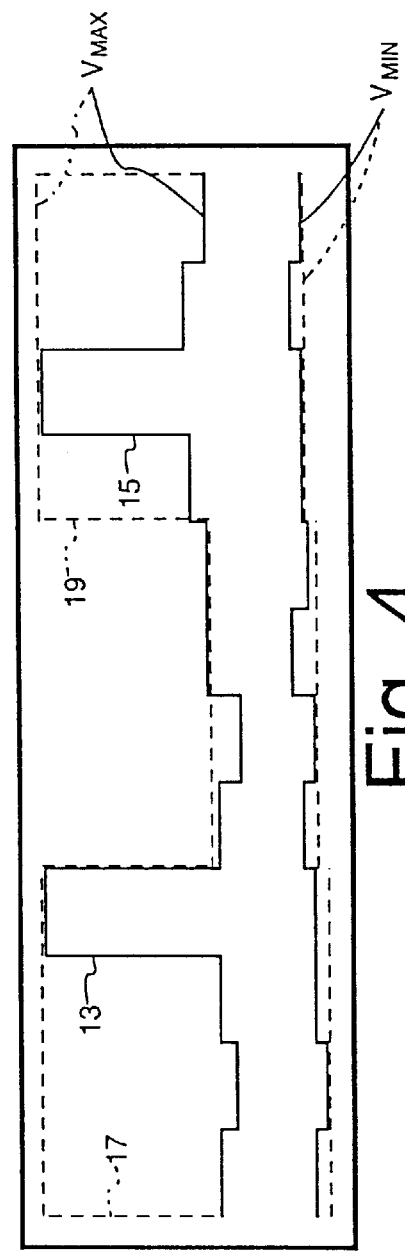

ELECTRONIC SIGNAL MEASUREMENT APPARATUS FOR THE ACQUISITION AND DISPLAY OF SHORT-DURATION ANALOG SIGNAL EVENTS

BACKGROUND OF THE INVENTION

1. Field of the Invention

The present invention relates generally to electronic signal measurement apparatus, and more particularly to a short-duration analog signal events acquisition and display system wherein the maximum and minimum magnitudes of a varying analog signal are detected by peak and valley detectors and then digitized by an analog-to-digital converter, stored and then read out at a slower rate for display in electronic strip chart format to highlight signal anomalies.

2. Description of the Prior Art

In the automotive repair field, as well as in other fields, it has long been important to have instruments available for observing electrical signals occurring at various points within the numerous electrical circuits and signal paths resident in an automobile. Measurements of parameters such as current, voltage, resistance, signal frequency, etc. enable a repair technician to locate and diagnose the numerous problems that occur in a vehicle. Such parameters are typically measured using available apparatus ranging from simple voltage, current and resistance-measuring meters to sophisticated, computerized electronic diagnostic equipment.

Among the most difficult conditions to measure are the intermittent faults commonly referred to as "glitches", i.e., rapid signal transitions of short duration. Previous measurement systems have either sampled the input analog signals slowly and have thereby ignored rapidly varying signal components, or have sought to detect the rapidly varying components by sampling at a rate higher than the rate of change of the signal. Sampling systems which sample at frequencies higher than the input signal frequency are well known in the art. For example, an oscilloscope which operates under this general principal contains complex and expensive electronics. At lower sampling rates, glitches might not be captured by the oscilloscope; at higher sampling rates, glitches are less likely to be displayed. Furthermore, the extra data derived from the much higher sampling rate, when converted to digital form, requires substantial computational capacity. A major shortcoming of the digital oscilloscope is the loss of data that usually occurs following the analog-to-digital conversion. Glitches occurring on the signal are generally captured by the conversion, but not all captured data is displayed.

Another difficulty with prior art sampling systems is that they use complicated electronics for triggering the capture of short-duration analog signal events. Prior art devices have typically utilized both trigger-level and trigger-delay circuitry. Trigger-level circuitry will allow detection of an event if its voltage potential rises above a certain preset level. Trigger-delay circuitry will delay detection of an event for a preset time period after the trigger-level circuitry has noted an event with a voltage potential above its preset level. While both of these techniques allow very accurate detection in voltage potential and time of occurrence, the information obtained is superfluous if all one really needs to know is that a particular event has occurred during a particular time period.

A further difficulty with prior art sampling systems is that if the prior art sampling system uses a single A/D converter on a multiple input-channel device, the sample rate is reduced by 1/n for n channels, further reducing the likelihood of detecting a glitch.

There is thus a need for a relatively simple means for detecting and indicating the occurrence of glitches in electrical circuits. Furthermore, there is a need for a device that "latches" a glitch and displays its occurrence in one of several selectable histogrammic formats so that the user does not have to carefully watch the indicator to notice the transient occurrence of a glitch.

SUMMARY OF THE INVENTION

It is therefore an object of the present invention to provide an improved apparatus for monitoring electrical signals to detect and indicate the occurrence of rapidly varying analog events, commonly referred to as glitches.

Another objective of the present invention is to provide glitch-detection and display apparatus that is simple to use and relatively low in cost.

Another object of the present invention is to provide apparatus of the type described which allows workers not experienced in the use of complex test instruments to observe short duration faults.

Still another object of the present invention is to provide apparatus of the type described that does not rely upon the use of fast sample rates to detect and display faults, and does not rely on user observation of the fault at the instant of its occurrence.

Yet another object of the present invention is to provide a system of the type described for detecting rapidly varying analog events using limited computational capacity by sampling at a relatively slow rate compared with the analog event to be detected.

Briefly, the present invention is embodied in the form of a hand-held instrument which includes maximum and minimum signal value detection circuits for capturing the extremes of a rapidly changing analog signal. The captured values are then digitized by a an analog-to-digital converter to generate data which can be stored and subsequently read out from memory and displayed in the form of a histogram evidencing the occurrence or lack of occurrence of a particular type of signal event.

An important advantage of the present invention is that it indicates the occurrence of otherwise difficult-to-detect events in a readily perceptible fashion.

Another advantage of the present invention is that it provides a histographic display of the occurrence of the events over a period of time.

Still another advantage of the present invention is that it can be used by workers inexperienced in the use of sophisticated test equipment.

These and other objects and advantages of the present invention will no doubt become apparent to those skilled in the art after having read the following detailed description of the preferred embodiment which is illustrated in the several figures of the drawing.

IN THE DRAWING

FIG. 3 is a display in realtime or near realtime of the wave form illustrated in FIG. 1 during a particular sample period;

FIG. 4 is a diagram generally illustrating the operative concept of the present invention;

FIG. 6 is an illustration of one type of graphical display provided by apparatus in accordance with the present invention.

DETAILED DESCRIPTION OF THE PREFERRED EMBODIMENT

Figure 2:
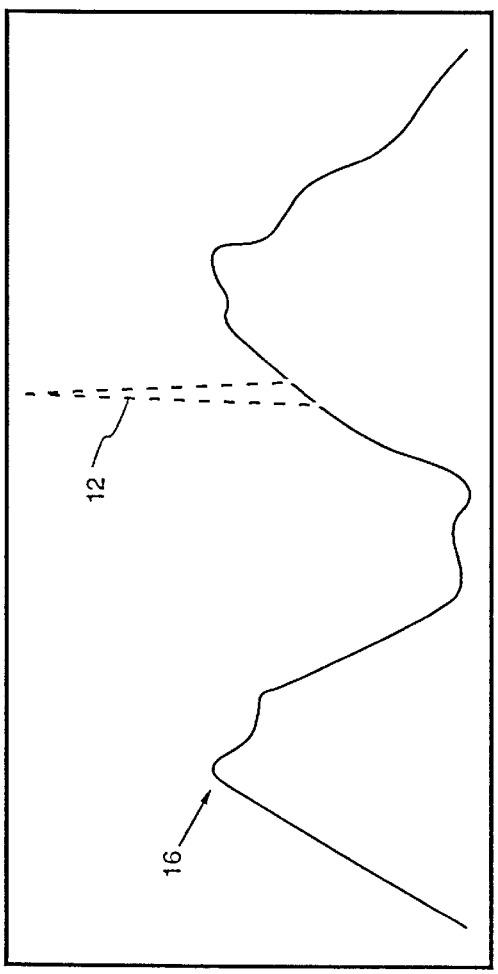
FIG. 2 is a diagram illustrating a typical oscilloscope type display of a portion of the wave form illustrated in FIG. 1.
Figure 1:
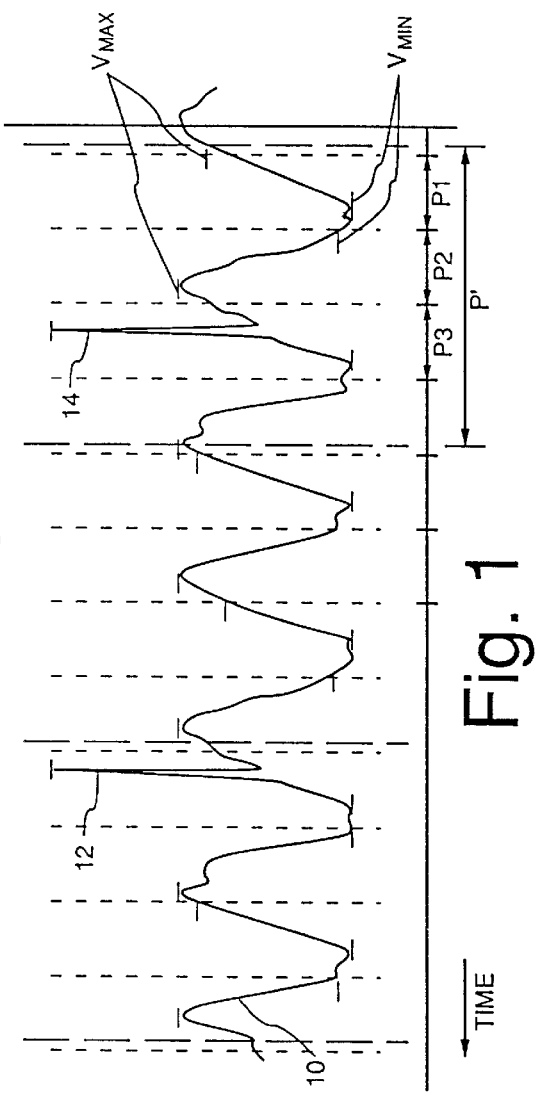
FIG. 1 is a diagram illustrating a typical voltage wave form including glitches of the type encountered in automotive diagnostics.

Referring now to FIG. 1 of the drawing, which depicts at 10 an alternating signal trace typical of the type of signal that might be detected in an automotive circuit. Depicted at 12 and 14 are signal glitches of the type mentioned above, i.e., random voltage spikes of very short duration normally indicative of some component malfunction or shorting condition. If one were to use an oscilloscope type of instrument in attempting to detect the glitches 12 and 14, he might choose to display one or two cycles of the wave form, as illustrated at 16 in FIG. 2. In using an oscilloscope, the user can choose to update the display on every cycle or every nth cycle of the signal. If he chooses to update every cycle, the change from display to display will be substantially imperceptible to the eye of the viewer, with the principal wave form merely appearing to have a slight jitter due to the signal variations illustrated in FIG. 1. When the cycle having the glitch 12 appears, it will appear very quickly and then disappear, usually at a rate that would make the spike or glitch 12 imperceptible. One way to make the glitch visible would be to sample at a much slower rate and hope that a glitch occurs during a sample period. Understandably, however, if the glitch does not occur during a sample period, it will not be detected.

On the other hand, sophisticated electronic detection circuitry could be used to display only those cycles having voltages substantially exceeding some threshold, in which case one could discriminate in favor of displaying only those signal cycles having glitches. However, unless the particular wave shape of the glitch was of particular significance, such information would normally be of little interest to a technician. What he usually wants to know is merely whether a glitch occurred, whether it was random or repetitive, and perhaps how its occurrence related to some other event.

Another alternative would be to simply display in realtime or near realtime all cycles within a given period, such as is illustrated in FIG. 3. However, for one to see glitches such as those illustrated at 12' and 14' would be problematical. Even though the sampling period covers a number of cycles, in the usual case the duration of each glitch would be extremely short, and to visually detect the occurrence of the glitch would require concentrated attention of the technician in order to note the signal transition. Furthermore, even if noted, the value of such information would be questionable.

Referring back to FIG. 1 of the drawing, a solution to the problem in accordance with the present invention will be conceptually discussed. In an embodiment of the invention to be described below, means is provided for monitoring and detecting the minimum voltage excursion $V_{min}$ and maximum voltage excursion $V_{max}$ of the signal 10 during sampling periods P of predetermined duration arbitrarily chosen but preferably including at least 180° of the input signal cycle. These voltage excursions are then held and sampled for digitization as described below.

Connecting the respective $V_{max}$ and $V_{min}$ values as indicated in FIG. 4 suggests that a histographic depiction of the minimum and maximum voltage excursions would be useful in revealing the occurrence and frequency of occurrence of the glitches 12 and 14. Note, for example, the prominence of the pulses 13 and 15 which correspond to the momentary signal excursions represented by the spikes 12 and 14 in FIG. 1. Several display options other than the continuously moving histogram are available in depicting the $V_{max}$ and $V_{min}$ values, including a wrap-around histogram drawing over histograms of previous time periods, and a flash-up histogram displaying one screen at a time rather than shifting out bars of the histogram over time. It is important to note that the present invention is not limited to the type of display format or display means.

Note also that the sampling periods need not directly correspond to the signal cycles. The periods P may be longer or shorter. The only criteria of importance is that the periods P be of such duration that spikes are sampled and detected. If so chosen, each glitch or spike in signal voltage will be dramatically visible. For example, if the sampling period P' had been chosen as P'=4P, the corresponding $V_{max}$ and $V_{min}$ would be as indicated by the dashed lines in FIG. 4, and the $V_{max}$ pulses 17 and 19 would indicate the occurrences of glitches 13 and 15; the point being that the intent of the present invention is merely to indicate that one or more anomalies have occurred during a sample period, not to provide qualitative or quantitative information concerning the anomalies.

Figure 5:
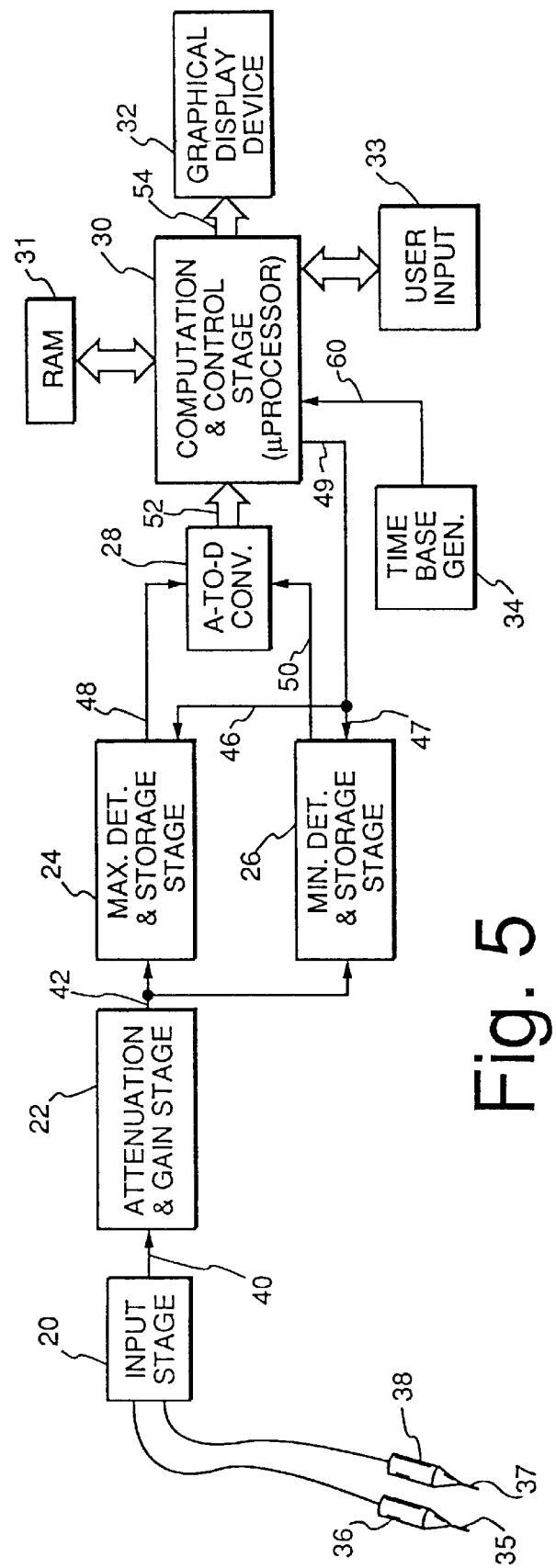
FIG. 5 is a block diagram illustrating the principal functional components of a signal measurement and display apparatus in accordance with the present invention.

Turning now to FIG. 5 of the drawing, which is a simplified block diagram illustrating an embodiment of the present invention, the device is shown to be comprised of an input stage 20, an attenuation and gain stage 22, a signal maximum detection and storage stage 24, a signal minimum detection and storage stage 26, an analog-to-digital conversion stage 28, a computation and control stage 30 (microprocessor), a random access memory (RAM) 31, a means for user input 33, a graphical display device 32, and a time base reference generator 34. As in other related types of metering devices, a pair of test probes 36 and 38 are provided having suitable contacting tips, clips or transducers 35 and 37 for engaging selected points in a circuit to be tested such that a voltage differential appears across the selected points, evidencing the current flow or potential levels to be detected or monitored. The probes 36 and 38 can be of any suitable configuration, and normally probe 36 would be considered the positive or hot probe while probe 38 might be considered the common or ground probe.

Input stage 20 interacts with the probes 36 and 38 to develop a signal at 40 which is an analog of the voltage difference sensed between the probe contact points. Signal 40 is then passed through attenuation and gain stage 22 wherein its signal level is adjusted up or down so as to be compatible with the remaining circuit elements. The enhanced signal is then output on line 42 for input to maximum detector 24 and minimum detector 26, which detect the $V_{max}$ and $V_{min}$ for output on lines 48 and 50 respectively. These analog signals are then coupled into the analog-to-digital converter 28 where they are digitized and output on bus 52. Computation and control stage (microprocessor) 30 then causes the signal values to be stored in RAM 31. Microprocessor 30 subsequently reads out the stored values and generates signals on bus 54 for driving the graphical display device 22. Microprocessor 30 also periodically generates reset signals on line 49 for input at 46 and 47 to reset the detectors 24 and 26, thus causing them to output the maximum and minimum signals to analog-to-digital converter 28 for conversion to digital signal values. The time base reference generator 34 provides a master clocking input at 60 to the microprocessor 30, whereby the microprocessor generates the reset signals periodically in accordance with user input or in accordance with an interval that is a function of the period as detected from the input signals.

It will thus be appreciated that by detecting the maximum and minimum signal values occurring during predetermined time intervals P (or P') to generate $V_{max}$ and $V_{min}$ for each sample period, and then digitizing and storing these values, such values can be subsequently read out of RAM 31 (and shifted in time) at a selected rate and used to drive a display in a histographic fashion such as is illustrated in FIG. 6, with each glitch being depicted in readily perceivable form, as indicated at 62 and 64. By histographic display it is meant that, by repetitively sampling and shifting the stored data, the illustrated signal can be made to appear to move across the screen 66 from left to right, creating a display reminiscent of a strip-chart recorder in which the recording medium is moving from left to right. By highlighting the displayed signal range between $V_{max}$ and $V_{min}$ as indicated at 60, the information content of the display can be enhanced. It is to be understood that other display formats can be used as well to facilitate observations of the glitches.

The stored $V_{max}$ and $V_{min}$ may be manipulated in a variety of manners. For example, the average of several consecutive sets of $V_{max}$ and $V_{min}$ values may be taken and displayed, or the highest and lowest values from the several consecutive sets may be taken and displayed. Furthermore, the number of consecutive $V_{max}$ and $V_{min}$ value sets taken for the above calculations can be changed to vary the rate of display.

Figure 7:
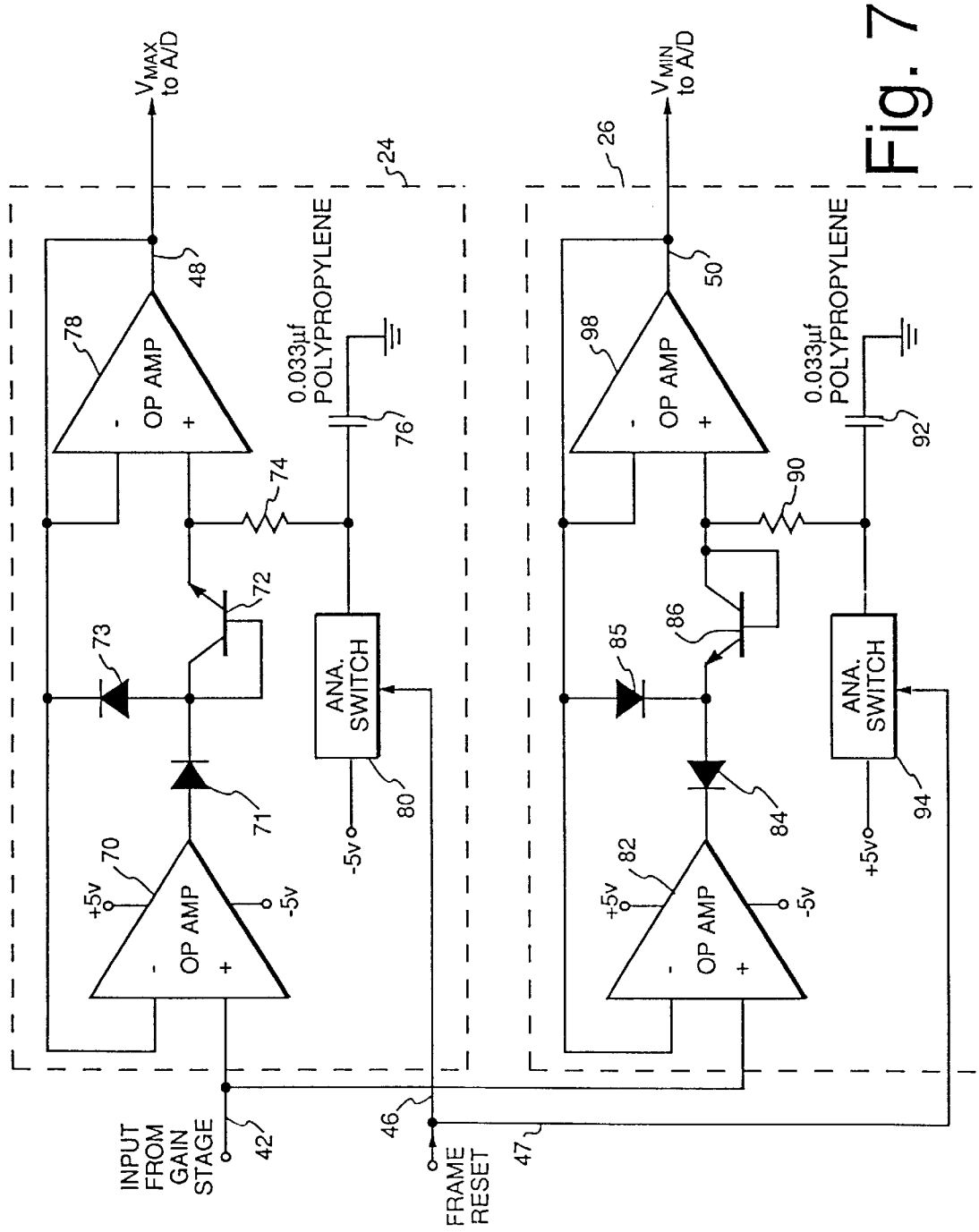
FIG. 7 is a schematic circuit diagram illustrating peak and valley detection circuits in accordance with the present invention.

Turning now to FIG. 7, a schematic circuit diagram is provided illustrating a preferred implementation of the maximum and minimum signal detection/storage stages 24 and 26. As depicted, the input on line 42 from the gain stage 22 (FIG. 5) is fed through a buffer amplifier 70, a blocking diode 71, a diode-connected transistor 72, and a current-limiting resistor 74 to a storage capacitor 76 which charges up to and holds the maximum voltage input during the sampling period P. This voltage is then output to terminal 48 through a buffer amplifier 78, to be sampled by the A/D. At the end of each period P, the stage is reset by a frame-reset signal 46 generated by microprocessor 30 (FIG. 5), which turns on the analog switch 80 to discharge the capacitor 76 to the negative power-supply rail. Note that because diodes 71 and 72 prevent discharge of capacitor 76 back into amplifier 70, the period P can extend over any number of cycles of the input signal (any selected period of time) and is thus not determined by the type of input wave form. Tracking diode 73 serves to cause the output signal 48 to respond faster to large input signal changes by bypassing the storage capacitor 76.

The minimum detection/storage stage 26 includes a buffer amplifier 82, a blocking diode 84, a tracking diode 85, a diode biased transistor 86, a current limiting resistor 90, and a storage capacitor 92. Stage 26 further includes means for resetting (recharging) capacitor 92 through an analog switch 94, and a buffer amplifier 98 for coupling $V_{min}$ out at 50. Stage 26 operates to capture on capacitor 92 the minimum voltage excursion during each sampled period of the wave form input at 42. Capacitor 92 is initially positively charged (rather than negatively charged as in circuit 24) by the reset signal applied at 46, and its charge is reduced by the signal input at 42. The corresponding $V_{min}$ value is then output via buffer amplifier 98 at 50, and the stage 26 is reset by the frame-reset input from the microprocessor on line 46.

The analog-to-digital converter 28 and the microprocessor stage 30 are of standard configuration, and in the preferred embodiment are respectively implemented using a ADC10158 converter manufactured by National Semiconductor and a M37451 microprocessor manufactured by Mitsubishi Electric. The graphical display device 32 in the preferred embodiment is an LCD display of the type made by Seiko Instruments.

As actually implemented, the present invention forms part of a graphing, digital multimeter and diagnostic database instrument manufactured by Balco, a division of Snap-on Incorporated. It will be appreciated, however, that the invention could be embodied as a stand-alone unit or as a component part of another indicator or diagnostic system.

Furthermore, although the present invention has been described above in terms of a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

We claim:

1. An apparatus for measuring and displaying electrical characteristics of a short duration input analog signal, comprising:

first and second signal flow paths in parallel with each other and connected for receiving the input analog signal, the first and second signal flow paths including respectively positive and negative peak detector circuits for storing positive and negative peak representations of said input analog signal during a prescribed measurement period;

a user input signal for defining the duration of said prescribed measurement period;

an A/D converter connected for receiving signals developed by said positive and negative peak detector circuits and producing corresponding digital data;

a digital memory;

a processor connected for receiving signals produced by said A/D converter and configured for supplying a reset signal to said positive and negative peak detector circuits for controlling said prescribed measurement period of said detectors in accordance with said user input signal, storing said digital data produced by said A/D converter in said memory, reading contents of said memory and generating a display signal representative of said stored digital data; and supplying said display signal to a user display to produce a histogram display providing an indication of said prescribed measurement period and the range of the input signal within each of successive prescribed measurements periods.

2. The apparatus of claim 1 wherein said indication of the prescribed measurement period firsts appear on a first end of said user display and appears to move to a second end of said user display, opposite said first end.

3. The apparatus of claim 2 wherein said histogram display is comprised of adjacent rectangles having a width corresponding to said prescribed measurement period and a height corresponding to said range of the input signal withing each of successive prescribed measurement periods.

4. The apparatus of claim 1 wherein said histogram display provides an indication of the average of the maximums and minimums of the input signal over at least two adjacent prescribed measurement periods.

5. The apparatus of claim 1 wherein said histogram display provides an indication of the maximum and minimum of the input signal over at least two adjacent prescribed measurement periods.

6. The apparatus of claim 1 wherein said positive and negative peak detector circuits include a positive peak detector capacitor and a negative peak detector capacitor, respectively, and said processor provides said reset signal for discharging said peak detect capacitors.

7. The apparatus of claim 1 wherein said user display is an LCD display screen.

8. The apparatus of claim 1 wherein said user display is provided on a handheld instrument.

* * * * *